United States Patent
Suefuji

(10) Patent No.: US 10,510,944 B2
(45) Date of Patent: Dec. 17, 2019

(54) VIBRATION ACTUATOR REDUCED IN COST AND SIZE, AND ELECTRONIC DEVICE

(71) Applicant: CANON KABUSHIKI KAISHA, Tokyo (JP)

(72) Inventor: Kei Suefuji, Tokyo (JP)

(73) Assignee: Canon Kabushiki Kaisha, Tokyo (JP)

(*) Notice: Subject to any disclaimer, the term of this patent is extended or adjusted under 35 U.S.C. 154(b) by 301 days.

(21) Appl. No.: 15/333,613

(22) Filed: Oct. 25, 2016

(65) Prior Publication Data

US 2017/0133579 A1 May 11, 2017

(30) Foreign Application Priority Data

Nov. 6, 2015 (JP) ................................. 2015-218404

(51) Int. Cl.
*H01L 41/09* (2006.01)
*H02N 2/02* (2006.01)
*H02N 2/00* (2006.01)
*G02B 7/08* (2006.01)

(52) U.S. Cl.
CPC ....... *H01L 41/0926* (2013.01); *H02N 2/0015* (2013.01); *H02N 2/0065* (2013.01); *H02N 2/026* (2013.01); *G02B 7/08* (2013.01)

(58) Field of Classification Search
CPC .......................... H01L 41/0926; H02N 2/0015; H02N 2/0065; H02N 2/026
USPC ........................................ 310/323.01–323.21
See application file for complete search history.

(56) References Cited

U.S. PATENT DOCUMENTS

2004/0189150 A1* 9/2004 Yamamoto ........... H02N 2/0015
310/323.02
2015/0137663 A1  5/2015 Kimura et al.

FOREIGN PATENT DOCUMENTS

JP  2009-011058 A  1/2009
JP  2015-104144 A  6/2015

* cited by examiner

*Primary Examiner* — Derek J Rosenau
(74) *Attorney, Agent, or Firm* — Venable LLP

(57) ABSTRACT

A vibration actuator can be reduced in manufacturing cost and size thereof without using a magnet. An elastic body of a vibration element includes a base portion joined to an electromechanical energy conversion element, and a pair of contact portions extending from the base portion. The contact portions are brought into pressure contact with a driven element, by elastic deformation, in a third direction orthogonal to both of a first direction of relative motion of the vibration element and the driven element and a second direction as a thickness direction of the conversion element. When driving vibration is excited in the vibration element by applying a predetermined AC voltage to the conversion element, the contact portions apply frictional driving forces to the driven element, for moving the vibration element and the driven element relative to each other in the first direction.

8 Claims, 11 Drawing Sheets

VIBRATION ACTUATOR REDUCED IN COST AND SIZE, AND ELECTRONIC DEVICE

BACKGROUND OF THE INVENTION

Field of the Invention

The present invention relates to a vibration actuator reduced in cost and size, and an electronic device equipped with the vibration actuator.

Description of the Related Art

A vibration actuator, in general, brings a vibration element and a driven element into pressure contact with each other, and causes a frictional driving force to act between the vibration element and the driven element by vibration excited in the vibration element, to thereby move the vibration element and the driven element relative to each other. As an example of the vibration actuator, there is known one having a structure that brings tops of two protrusions provided on a vibration element and a driven element into pressure contact with each other (see e.g. Japanese Patent Laid-Open Publication No. 2015-104144). The vibration element as a component of the vibration actuator described in Japanese Patent Laid-Open Publication No. 2015-104144 includes a plate-shaped elastic body, the two protrusions provided on one of surfaces of the elastic body, and a piezoelectric element (electromechanical energy conversion element) provided on (joined to) the other of the surfaces of the elastic body opposite to the surface provided with the protrusions.

When driving the vibration actuator having this structure, two AC voltages having a phase difference therebetween are applied from a drive circuit to the piezoelectric element as driving voltages. By applying the driving voltages, vibrations in two bending vibration modes are simultaneously excited in the vibration element, and extremity ends of the two protrusions are caused to perform elliptic motion within a plane including a direction connecting between the two protrusions and a direction in which the two protrusions protrude from the elastic body, whereby the driven element receives a frictional driving force from the two protrusions. Thus, for example, in the vibration actuator having the vibration element fixed to a fixing member, it is possible to move the driven element in the direction connecting the two protrusions.

The vibration actuator described in Japanese Patent Laid-Open Publication No. 2015-104144 has a pressure plate disposed on a bottom surface (surface opposite to the surface joined to the elastic body) of the piezoelectric element, with a felt therebetween, and employs pressure means for pressing the pressure plate toward the driven element using a pressure spring, to thereby press the vibration element against the driven element. In doing this, a guide portion is provided on the fixing member that holds the driven element, for receiving a reaction force of a pressure force, whereby it is possible to realize a stable pressurized state of the vibration element without hindering vibration excited in the vibration element. On the other hand, Japanese Patent Laid-Open Publication No. 2009-11058 proposes a vibration actuator that is configured, for the purpose of reduction of the size and thickness thereof, such that a magnetic force of a permanent magnet as a different pressure means generates a pressure contact force for bringing a vibration element and a driven element into pressure contact with each other.

However, the pressure means described in Japanese Patent Laid-Open Publication No. 2015-104144 has a problem that since the pressure spring and the felt are required, the number of components is increased. Further, even through the size of the vibration element is reduced, it is difficult to realize size reduction of the whole vibration actuator due to an increase in the number of components. Further, the guide portion for receiving the reaction force of the pressure force requires a structure which is large in rated load, and hence it is difficult to reduce the size of the guide portion.

On the other hand, in the pressure means described in Japanese Patent Laid-Open Publication No. 2009-11058, although the pressure spring and the component for receiving the reaction force of the pressure spring are not required, the permanent magnet for generating the magnetic force is required, and hence the manufacturing cost of the vibration actuator is increased. Further, in a case where the permanent magnet is used, sensors and other like components disposed within an apparatus for which the vibration actuator is provided may undergo malfunction due to magnetism of the permanent magnet. Therefore, this imposes a restriction that the vibration actuator should be disposed sufficiently away from the sensors and other like components, which hinders the size reduction of the apparatus. Further, differently from a DC motor and a stepping motor, the vibration actuator is non-magnetic, and hence it is possible to use the vibration actuator under an environment with a strong magnetic field, but with the use of the permanent magnet therein, there is a fear that the vibration actuator can no longer be used under the environment with a strong magnetic field.

SUMMARY OF THE INVENTION

The present invention provides a vibration actuator that makes it possible to reduce the manufacturing cost and size thereof without using a magnet.

In a first aspect of the present invention, there is provided a vibration actuator in which a vibration element and a driven element are brought into pressure contact with each other, and driving vibration is excited in the vibration element to thereby move the vibration element and the driven element relative to each other in a first direction, the vibration element comprising an electromechanical energy conversion element that has a flat plate shape, and an elastic body that includes a base portion which is joined to the electromechanical energy conversion element, and a pair of contact portions extending from the base portion, wherein the pair of contact portions are brought into pressure contact with the driven element, by elastic deformation, in a third direction orthogonal to both of the first direction and a second direction which is a direction of a thickness of the electromechanical energy conversion element, and when the driving vibration is excited in the vibration element by applying a predetermined AC voltage to the electromechanical energy conversion element, the pair of contact portions apply frictional driving forces for moving the vibration element and the driven element relative to each other in the first direction, to the driven element.

In a second aspect of the present invention, there is provided an electronic apparatus including a vibration actuator in which a vibration element and a driven element are brought into pressure contact with each other, and driving vibration is excited in the vibration element to thereby move the vibration element and the driven element relative to each other in a first direction, and a member that is positioned by driving the vibration actuator, the vibration element comprising an electromechanical energy conversion element that has a flat plate shape, and an elastic body that includes a base portion which is joined to the electromechanical energy conversion element, and a pair of contact portions extending from the base portion, wherein the pair of contact portions are brought into pressure contact with the driven element, by elastic deformation, in a third direction orthogonal to both of the first direction and a second direction which is a direction of a thickness of the electromechanical energy conversion element, and when the driving vibration is excited in the vibration element by applying a predetermined AC voltage to the electromechanical energy conversion element, the pair of contact portions apply frictional driving forces for moving the vibration element and the driven element relative to each other in the first direction, to the driven element.

According to the present invention, it is possible to realize reduction of the manufacturing cost and size of the vibration actuator without using a magnet.

Further features of the present invention will become apparent from the following description of exemplary embodiments (with reference to the attached drawings).

DESCRIPTION OF THE EMBODIMENTS

The present invention will now be described in detail below with reference to the accompanying drawings showing embodiments thereof.

Figure 1A:
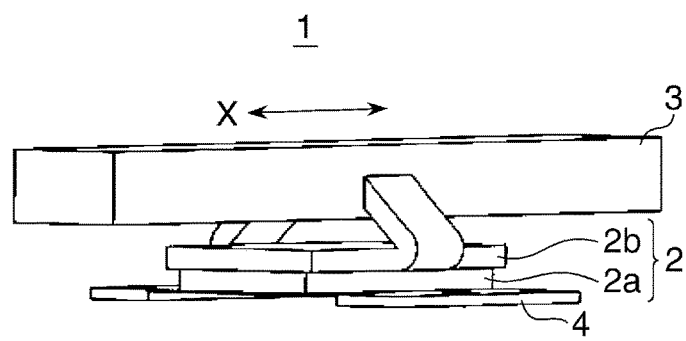
FIG. 1A is a schematic perspective view of a vibration actuator according to a first embodiment of the present invention.
Figure 1B:
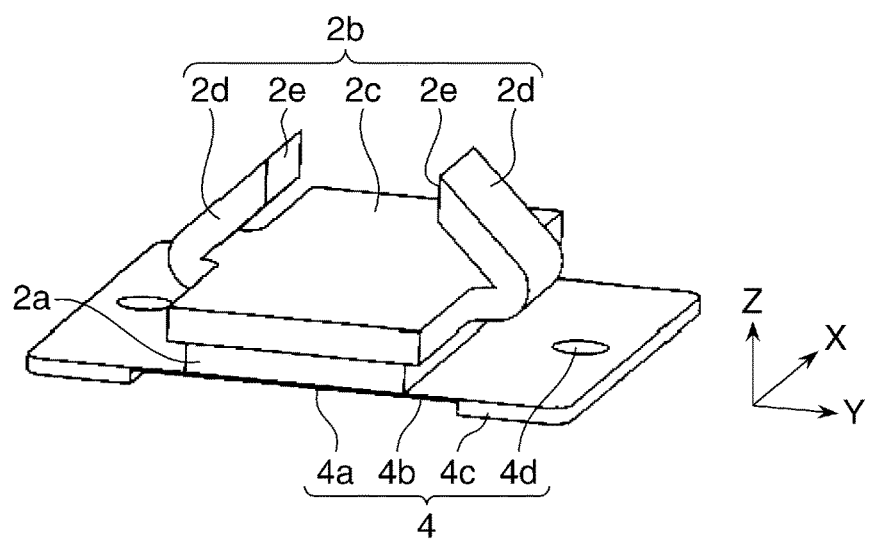
FIG. 1B is a perspective view of a structure of a vibration element as a component of the vibration actuator.

FIG. 1A is a schematic perspective view of a vibration actuator 1 according to a first embodiment of the present invention. The vibration actuator 1 includes a vibration element 2, and a driven element 3 that is brought into pressure contact with the vibration element 2. FIG. 1B is a perspective view of a structure of the vibration element 2. The vibration element 2 includes a piezoelectric element 2a, having a flat plate shape, which is an electromechanical energy conversion element that converts an electric amount to a mechanical amount, and an elastic body 2b which is joined to the piezoelectric element 2a. The vibration element 2 has its piezoelectric element 2a joined to a support member 4, whereby it is held by the support member 4.

For convenience of explanation, an X direction (first direction) is defined as indicated in FIG. 1A, and a Z direction (second direction) and a Y direction (third direction), which are orthogonal to the X direction, are defined as indicated in FIG. 1B. The X direction is a direction in which the vibration element 2 and the driven element 3 are moved relative to each other, the Z direction is a direction of the thickness of the piezoelectric element 2a, and the Y direction is a direction orthogonal to the X direction and the Z direction.

The elastic body 2b includes a base portion 2c and a pair of contact portions 2d provided in a manner protruding from opposite ends of the base portion 2c in the Y direction. A pair of contact surfaces 2e formed on respective sides of the contact portions 2d toward the driven element 3 are brought into contact with side surfaces of the driven element 3 in the Y direction, respectively, to thereby frictionally drive the driven element 3. The elastic body 2b is an elastic member made of metal, e.g. a martensitic stainless steel. Further, the elastic body 2b is subjected to e.g. quenching treatment as hardening treatment for increasing durability thereof.

Figure 1C:
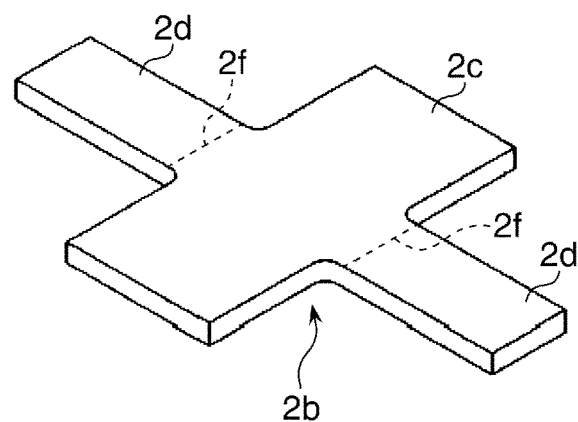
FIG. 1C is a perspective view of a substantially cross-shaped metal plate in a state before being bent into the shape of an elastic body as a component of the vibration element.

FIG. 1C is a perspective view of a substantially cross-shaped metal plate in a state before being bent into the shape of the elastic body 2b. The substantially cross-shaped metal plate is manufactured by working a plate material, such as a stainless steel plate, such that the base portion 2c and the contact portions 2d are formed into a substantially cross shape, by one of cutting, laser-processing, etching, and blanking, or any combination of these.

The substantially cross-shaped metal plate is bent at broken lines 2f in FIG. 1C such that an angle formed by the base portion 2c and each contact portion 2d becomes an acute angle, whereby it is possible to form the pair of contact portions 2d opposed to each other in the Y direction, as shown in FIG. 1B. In the present embodiment, the angle formed by the base portion 2c and each contact portion 2d is set to approximately 45 degrees. The contact surfaces 2e formed on the contact portions 2d, which are brought into contact with the driven element 3, are each shaped e.g. by lapping treatment such that the contact surfaces 2e can be brought into smooth contact with sliding surfaces of the driven element 3 after pressing the driven element 3 by a pressurizing method, described hereinafter.

As described above, in the elastic body 2b, the contact portions 2d which frictionally slide on the driven element 3 are formed integrally with the base portion 2c by bending a metal plate. On the other hand, in the vibration element having the two protrusions, described as the conventional technique in Japanese Patent Laid-Open Publication No.

2015-104144, the protrusions which frictionally slide on the driven element are formed by drawing of the plate-shaped elastic body. Therefore, the elastic body 2b is easier in working (manufacturing) than a case where the protrusions are formed by the conventional method. Further, in the vibration element having protrusions formed by the conventional drawing method, a non-joined area is generated between the elastic body and the piezoelectric element on a portion where the protrusions are formed. On the other hand, in the vibration element 2, a non-joined area is not generated between the base portion 2c of the elastic body 2b and the piezoelectric element 2a, and hence it is possible to increase the joining strength between the elastic body 2b and the piezoelectric element 2a.

The driven element 3 is a rectangular columnar elastic member, and is made of stainless steel in the present embodiment. As hardening treatment for increasing durability (wear resistance) of the driven element 3, frictional sliding surfaces (side surfaces in the Y direction) thereof for being brought into contact with the contact surfaces 2e of the contact portions 2d are subjected to e.g. nitriding treatment.

The support member 4 is formed by a flexible wiring board having a base film formed of polyimide or the like, and includes a power supply portion 4a, thin plate portions 4b, fixed portions 4c, and fixing holes 4d. The power supply portion 4a is joined to the piezoelectric element 2a e.g. with an adhesive, and applies a driving voltage to the piezoelectric element 2a. The fixed portions 4c are formed by a lining material of the flexible wiring board, and are fixed to a base, not shown. A method of fixing the fixed portions 4c to the base is not particularly limited, but for example, bottom surfaces of the fixed portions 4c (surfaces opposite to the surfaces on which the vibration element 2 is disposed) may be fixed to the base e.g. with an adhesive by making use of the fixing holes 4d for positioning. In doing this, it is also desirable to insert screws or vises through the fixing holes 4d, and screw the same in screw holes or hole portions formed in the base.

Each of the thin plate portions 4b extending between the power supply portion 4a and an associated one of the fixed portions 4c is a thin flexible wiring board portion which is not joined to the piezoelectric element 2a, and hence is lower in rigidity than the fixed portion 4c. Therefore, the thin plate portions 4b each function as a vibration isolation portion that prevents driving vibration excited in the vibration element 2 from being transmitted to the associated one of the fixed portions 4c. Thus, because of the provision of the thin plate portions 4b, the support member 4 is capable of flexibly supporting the vibration element 2, and hence is capable of holding the vibration element 2 without hindering vibration of the vibration element 2.

Next, a description will be given of two vibration modes excited in the vibration element 2 (a first vibration mode and a second vibration mode) with reference to FIGS. 2A to 3B. Driving vibration excited in the vibration element 2 is formed by a combination of vibration in the first vibration mode and vibration in the second vibration mode.

Figure 2A:
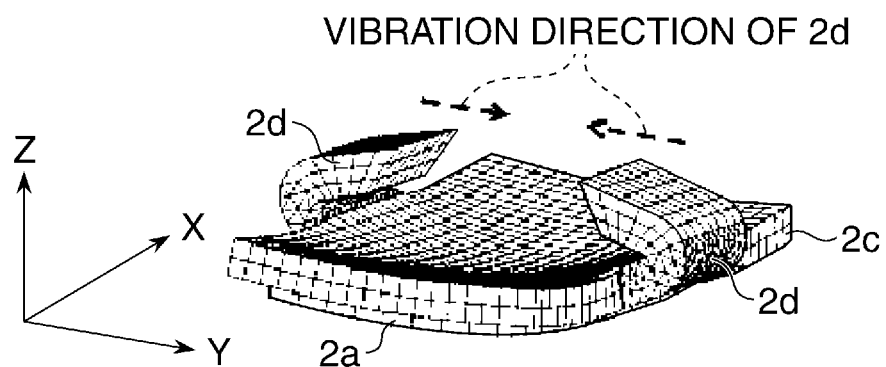
FIGS. 2A and 2B are perspective views useful in explaining deformation of the vibration element in a first vibration mode excited in the vibration element.
Figure 2B:
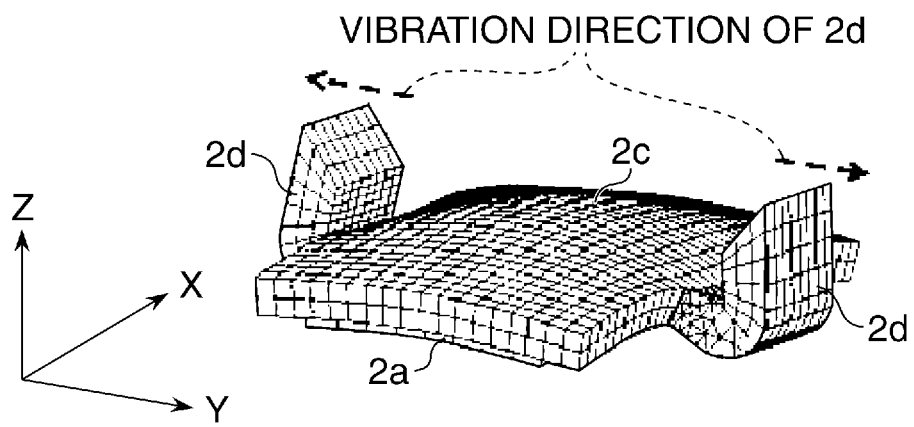

FIGS. 2A and 2B are perspective views useful in explaining deformation of the vibration element 2 in the first vibration mode excited in the vibration element 2. Note that in FIGS. 2A and 2B, to make a deformed shape of the vibration element 2 easier to recognize, the vibration element 2 is illustrated with deformation enlarged (exaggerated) compared with the shape of the vibration element 2.

In the first vibration mode, a first-order flexural vibration in the Y direction orthogonal to both of the X direction and the Y direction is excited in the base 2c of the vibration element 2. This first-order flexural vibration includes two nodal lines substantially parallel to the X direction. The pair of contact portions 2d are caused to perform reciprocal motion by vibration in the first vibration mode in which the contact portions 2d are repeatedly moved closer to each other as shown in FIG. 2A and away from each other as shown in FIG. 2B, in the Y direction.

Figure 3A:
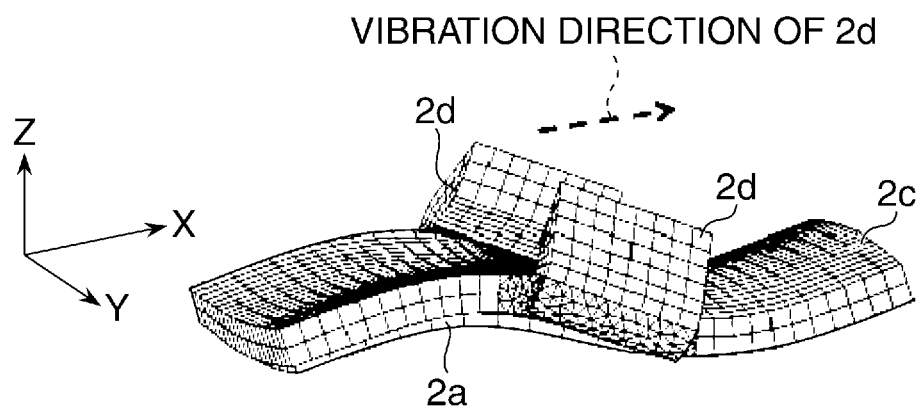
FIGS. 3A and 3B are perspective views useful in explaining deformation of the vibration element in a second vibration mode excited in the vibration element.
Figure 3B:
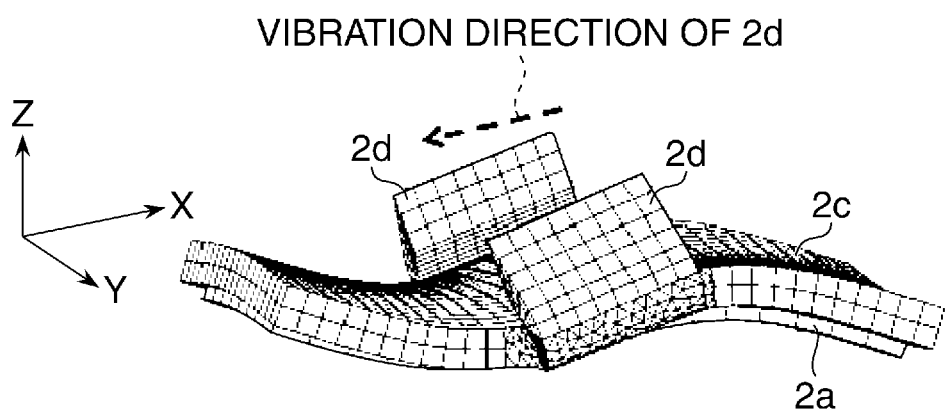

FIGS. 3A and 3B are perspective views useful in explaining deformation of the vibration element 2 in the second vibration mode excited in the vibration element 2. Also in FIGS. 3A and 3B, to make a deformed shape of the vibration element 2 easier to recognize, the vibration element 2 is illustrated with deformation enlarged compared with the shape of the vibration element 2.

In the second vibration mode, a second-order flexural vibration in the X direction which is a direction of the movement of the driven element 3 is excited in the base portion 2c of the vibration element 2. This second-order flexural vibration has three nodal lines substantially parallel to the Y direction. The pair of contact portions 2d are caused to perform reciprocal motion in the X direction by vibration in the second vibration mode. Here, by arranging the contact portions 2d in the vicinity of a location where a node of vibration in the second vibration mode is formed, it is possible to maximally deform the contact portions 2d in the X direction.

Dimensions of the base portion 2c of the elastic body 2b in the X direction and the Y direction, a dimension of each contact portion 2d in the Z direction, and so forth are designed such that a natural vibration frequency in the first vibration mode and a natural vibration frequency in the second vibration mode are substantially equal to each other.

Figure 4:
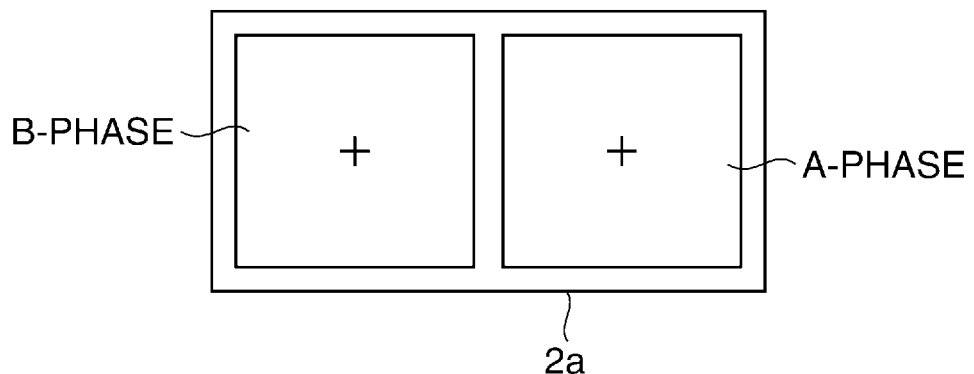
FIG. 4 is a plan view showing electrode configuration on a surface of a piezoelectric element as a component of the vibration actuator, via which the piezoelectric element is joined to a fixed portion of a support member.

FIG. 4 is a plan view showing electrode configuration on a surface of the piezoelectric element 2a, via which the piezoelectric element 2a is joined to the power supply portion 4a of the support member 4. The piezoelectric element 2a has a structure in which electrodes are provided on front and reverse surfaces of plate-shaped piezoelectric ceramics as an example of the electromechanical energy conversion element.

The surface of the piezoelectric element 2a, via which the piezoelectric element 2a is joined to the power supply portion 4a of the support member 4, is provided with two electrodes, i.e. an A-phase electrode and a B-phase electrode. A mark "+" in FIG. 4 indicates a polarization direction of the piezoelectric ceramics, and indicates that the polarization direction of the piezoelectric ceramics is the same in the A-phase and B-phase electrode areas. Note that a surface of the piezoelectric element 2a, via which the piezoelectric element 2a is joined to the elastic body 2b, is provided with one full-surface electrode (not shown) which covers the whole surface, and the full-surface electrode is used as a ground electrode (earth).

When AC voltages having the same frequency in the vicinity of the natural vibration frequencies in the first vibration mode and the second vibration mode and the same phase are applied to the A-phase and B-phase electrodes, respectively, vibration in the first vibration mode is excited. Further, when AC voltages having the same frequency in the vicinity of the natural vibration frequencies in the first vibration mode and the second vibration mode and opposite phases are applied to the A-phase and B-phase electrodes, respectively, vibration in the second vibration mode is excited. In view of this, by applying AC voltages having the same frequency in the vicinity of the natural vibration frequencies and phases which are neither the same phase nor opposite phases to the A-phase and B-phase electrodes, respectively, respective vibrations in the first vibration mode and the second vibration mode are simultaneously excited in the vibration element 2.

By combining the vibrations in the first and second vibration modes, the contact surfaces 2e of the pair of contact portions 2d are caused to perform elliptic motion substantially within an X-Y plane. The driven element 3 is frictionally driven in substantially the same orientation in the X direction by the elliptic motion of the contact surfaces 2e, and it is possible to linearly drive the driven element 3 relative to the vibration element 2. By applying an AC voltage, which is delayed from an AC voltage applied to the A-phase electrode by 90 degrees, to the B-phase electrode, it is possible to move the driven element 3 in one orientation in the X direction, and by applying an AC voltage, which is advanced from the AC voltage applied to the A-phase electrode by 90 degrees, to the B-phase electrode, it is possible to move the driven element 3 in the other orientation in the X direction.

Figure 5A:
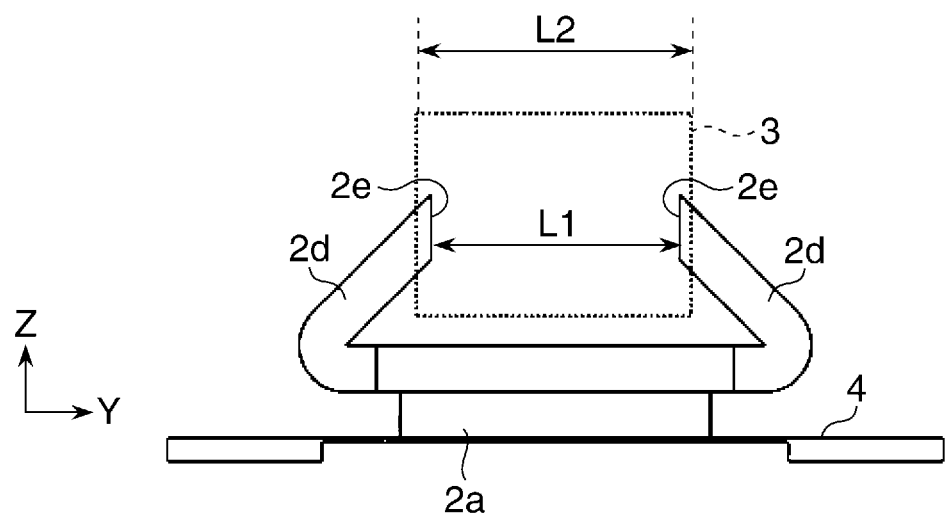
FIGS. 5A and 5B are side views of the vibration actuator in respective states before and after a driven element is set in the vibration element.
Figure 5B:
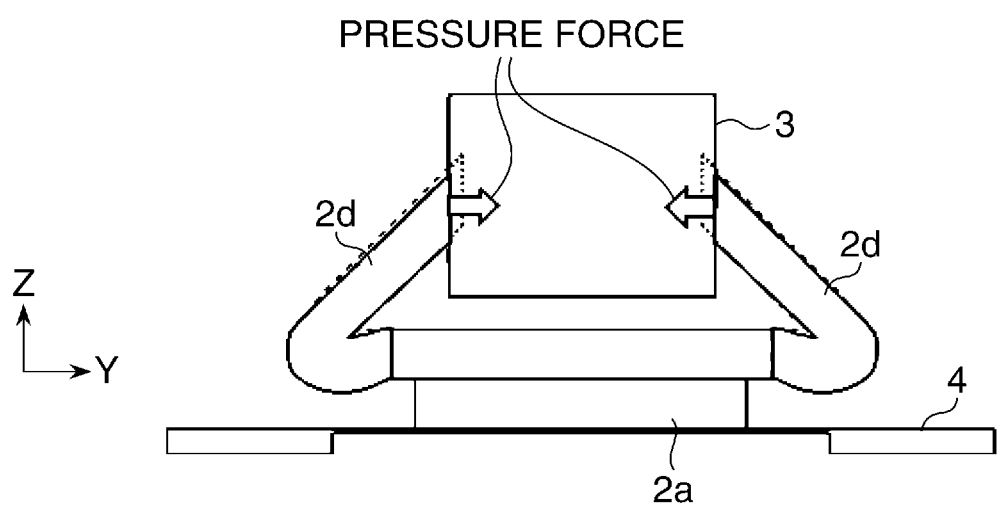

FIG. 5A is a side view (as viewed in the X direction) of the vibration actuator 1 in a state before the driven element 3 is set in the vibration element 2, and FIG. 5B is a side view showing a state after the driven element 3 is set in the vibration element 2. As shown in FIG. 5A, the pair of contact portions 2d of the vibration element 2 are formed such that, in a state before assembling the vibration element 2 and the driven element 3, a distance L1 between the two opposed contact surfaces 2e of the pair of contact portions 2d in the Y direction is shorter than a length L2 of the driven element 3 in the Y direction. Therefore, when the vibration element 2 and the driven element 3 are assembled as shown in FIG. 5B, the pair of contact portions 2d are elastically deformed such that the contact surfaces 2e thereof are more separated from each other in the Y direction, and are brought into pressure contact with the side surfaces of the driven element 3 in the Y direction. Note that in FIG. 5B, to make deformation of the contact portions 2d easier to recognize, the contact portions 2d are each illustrated with deformation enlarged compared with the shape of the contact portions 2d.

The magnitude of the pressure force that acts from each of the contact portions 2d on the driven element 3 can be set to a desired value e.g. by increasing or reducing the amount of deformation of the contact portions 2d in the Y direction, or changing rigidity of the contact portions 2d in the Y direction. The pressure forces applied from the contact surfaces 2e of the pair of contact portions 2d to the driven element 3 act on the driven element 3 in a manner sandwiching the driven element 3 in the Y direction. Thus, the vibration element 2 has a structure that the reaction force of the pressure force which acts from one of the contact portions 2d on the driven element 3 is received by the other contact portion 2d, and hence it is unnecessary to provide a portion for receiving the reaction force of the pressure force that acts on the driven element 3 other than the pair of contact portions 2d.

That is, the vibration actuator 1 does not require members, such as a pressure spring and a felt, which are required for the conventional vibration actuator to bring the driven element and the vibration element into pressure contact with each other in the Z direction. Therefore, the vibration actuator 1 can be manufactured with the reduced number of components and lower costs, and further can be downsized (particularly in the Z direction). Further, no magnet is used in the vibration actuator 1, and hence the vibration actuator 1 can be used even under an environment with a strong magnetic field.

Each contact portion 2d is formed to have a thickness having a spring property, and has an effect as a contact spring which can be brought into stable contact with the driven element 3. Therefore, it is possible to stably bring the contact surfaces 2e into contact with the driven element 3, which makes it possible to realize stable driving. Further, in a case where a guide for guiding the driven element 3 is provided e.g. on an upper surface of the driven element 3, the guide is not required to receive the pressure forces, and hence the driven element 3 can be guided by a guide having a small rated load, which makes it possible to smoothly drive the driven element 3.

Further, in the vibration actuator 1, vibrations in the first vibration mode and the second vibration mode are simultaneously excited only by one piezoelectric element 2a. With this configuration, it is possible to simplify the power supplying method, compared e.g. with a configuration in which another piezoelectric element for exciting vibration in the first vibration mode in the contact portions 2d is provided. Further, this makes it possible to reduce the vibration loss of the vibration actuator 1, and also makes it possible to reduce the size thereof.

Further, in the vibration actuator 1, the direction of driving the driven element 3 is the X direction orthogonal to the Z direction which is a direction of the thickness of the piezoelectric element 2a. Therefore, it is unnecessary to provide the piezoelectric element 2a with, for example, a through hole or the like for allowing the driven element 3 to escape, and hence it is possible to form the piezoelectric element 2a into a simple rectangular shape. This makes it possible to prevent the vibration element 2 from being asymmetrically deformed between the first vibration mode and the second vibration mode, and thereby realize stable driving. Note that the piezoelectric element 2a can be formed into a simple rectangular shape, so that it is possible to prevent the piezoelectric element 2a from cracking when the piezoelectric element 2a is manufactured or when the piezoelectric element 2a and the elastic body 2b are bonded, whereby productivity can be increased.

An angle formed by each contact portion 2d and the base 2c is set to 45 degrees in the above description. However, the angle formed by each contact portion 2d and the base 2c is not limited to this, but is only required to be an angle which makes it possible to sandwich the driven element 3 with appropriate pressure forces, and make the resonance frequency in the first vibration mode and that in the second vibration mode substantially match each other.

Further, in the above description, as a method of controlling the direction of driving the driven element 3, the method of switching the phase difference between AC voltages applied to the A-phase electrode and the B-phase electrode of the piezoelectric element 2a between +90 degrees and −90 degrees is employed. However, the manner of switching the phase difference between AC voltages applied to the A-phase electrode and the B-phase electrode is not limited to this, but the phase difference therebetween can be changed within a range from 0 degree to ±180 degrees according to the relative moving speed between the driven element 3 and the vibration element 2.

Further, in the above description, as the electrode configuration of the piezoelectric element 2a, the electrode is divided in two in the X direction as shown in FIG. 4. However, the electrode configuration of the piezoelectric element 2a is not limited to this, but the piezoelectric element 2a is only required to have a configuration in which vibrations in the first vibration mode and the second vibration mode can be simultaneously excited. Further, although the contact portions 2*d* of the elastic body 2*b* can be formed by bending a substantially cross-shaped metal plate, as described above, this is not limitative, but the contact portions 2*b* can be formed by any other suitable method, such as cutting, insofar as each contact portion 2*b* can be formed into a desired shape.

Figure 6A:
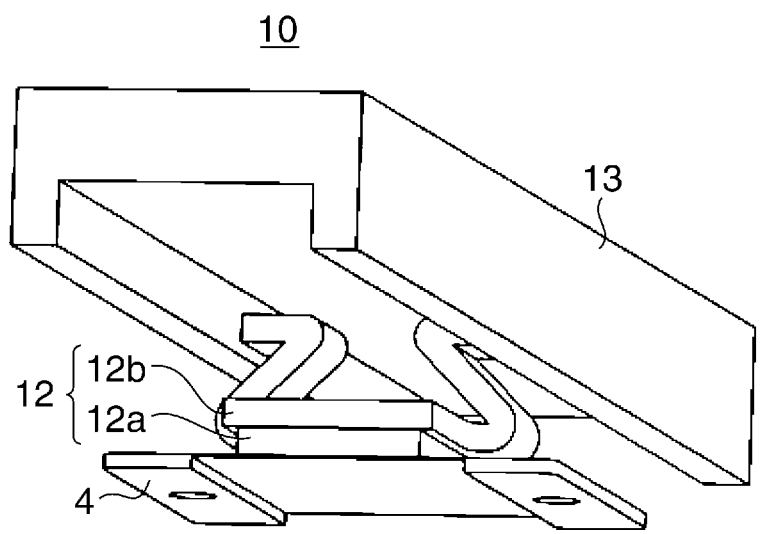
FIG. 6A is a schematic perspective view of a vibration actuator according to a second embodiment of the present invention.
Figure 6B:
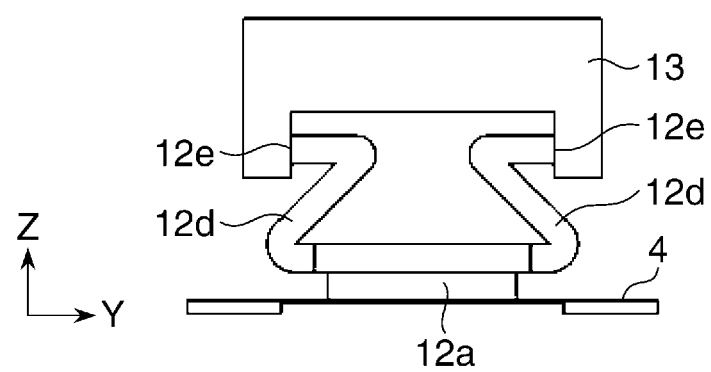
FIG. 6B is a schematic side view of the vibration actuator.

Next, a description will be given of a second embodiment of the present invention. FIG. 6A is a schematic perspective view of a vibration actuator 10 according to the second embodiment. FIG. 6B is a schematic side view of the vibration actuator 10. The vibration actuator 1 according to the first embodiment is configured to sandwich the driven element 3 between the pair of contact portions 2*d* of the vibration element 2. On the other hand, the vibration actuator 10 according to the second embodiment has a configuration that a pair of contact portions 12*d* of a vibration element 12 are sandwiched between wall portions provided on a driven element 13, as described hereafter.

The vibration actuator 10 includes the vibration element 12 and the driven element 13. The vibration element 12 includes a piezoelectric element 12*a* and an elastic body 12*b*. The piezoelectric element 12*a* is the same as the piezoelectric element 2*a*, described above, of the first embodiment, and hence description thereof is omitted. Similar to the first embodiment, the piezoelectric element 12*a* is joined to the support member 4, whereby the vibration element 12 is fixed to the support member 4.

The driven element 13 has a substantially U-shaped configuration as viewed from the side (viewed in the X direction). Further, the elastic body 12*b* includes the pair of contact portions 12*d* which are bent and formed such that contact surfaces 12*e* as extremity ends are oriented in respective opposite directions away from each other in the Y direction. The pair of contact portions 12*d* are brought into contact with side surfaces of a recess of the driven element 13 (Z-X planes opposed to each other in the recess in the Y direction), and are sandwiched between the side surfaces of the recess to thereby cause pressure forces to act on the side surfaces of the recess.

The pair of contact portions 12*d* are formed such that a distance between the contact surfaces 12*e* as the extremity ends of the pair of contact portions 12*d* in the Y direction is longer than a distance between the side surfaces of the recess of the driven element 13 in the Y direction in a state before assembling the vibration element 12 and the driven element 13. Therefore, when the vibration element 12 and the driven element 13 are assembled, the pair of contact portions 12*d* are elastically deformed such that the contact surfaces 12*e* as the respective extremity ends become closer to each other in the Y direction, and the contact surfaces 12*e* of the contact portions 12*d* are brought into pressure contact with the side surfaces of the recess of the driven element 13.

The vibration actuator 10 also has the structure that the reaction force of the pressure force applied from one of the pair of contact portions 12*d* is received by the other contact portion 12*d*, and hence it is unnecessary to receive the reaction forces of the pressure forces that act on the driven element 13, with other portions than the pair of contact portions 12*d*. Therefore, similar to the vibration actuator 1, the vibration actuator 10 makes it possible to simplify the pressurizing structure for bringing the vibration element 12 and the driven element 13 into pressure contact with each other, whereby it is possible to obtain the same advantageous effects as provided by the vibration actuator 1.

Figure 7A:
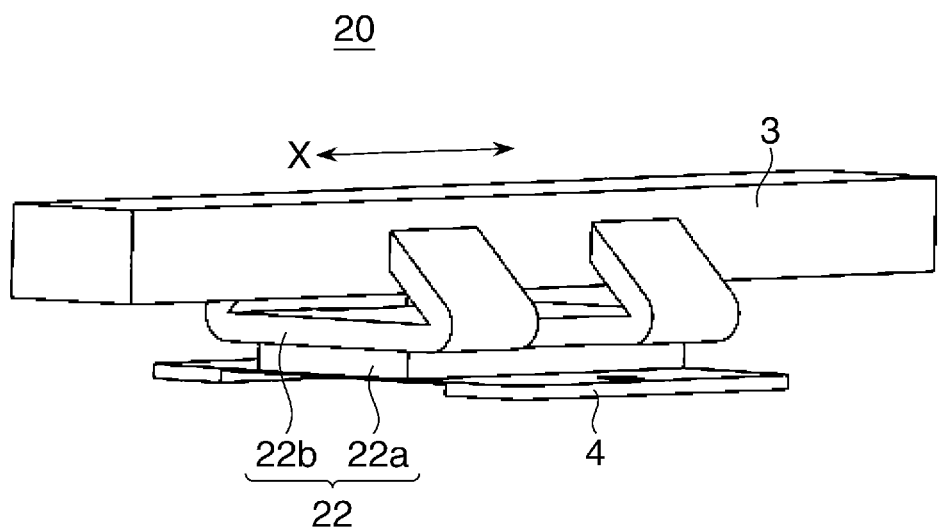
FIG. 7A is a schematic perspective view of a vibration actuator according to a third embodiment of the present invention.

Next, a description will be given of a third embodiment of the present invention. FIG. 7A is a schematic perspective view of a vibration actuator 20 according to the third embodiment. The vibration actuator 20 differs from the vibration actuator 1 according to the first embodiment in that a vibration element 22 is provided in place of the vibration element 2 as a component of the vibration actuator 1. Therefore, in the following description, components of the vibration actuator 20 other than the vibration element 22 are denoted by the same reference numerals of those of the vibration actuator 1, and description thereof is omitted.

Figure 7B:
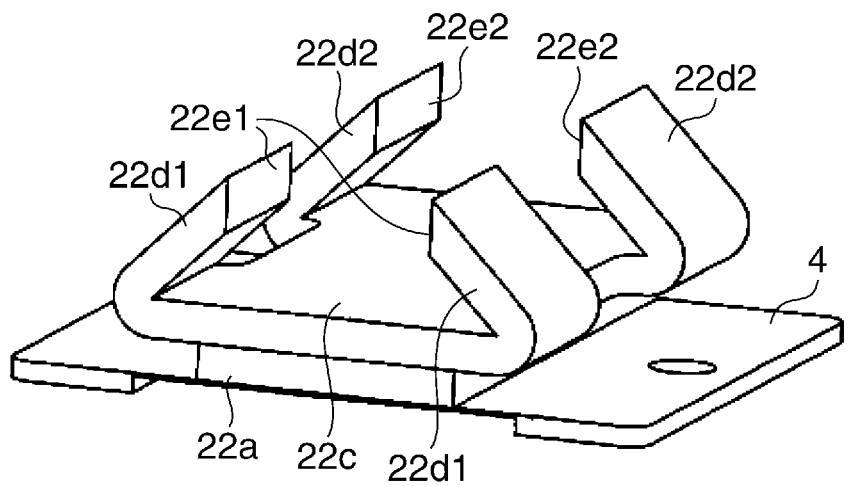
FIG. 7B is a perspective view of a structure of a vibration element as a component of the vibration actuator.

FIG. 7B is a perspective view of a structure of the vibration element 22. The vibration element 22 includes an elastic body 22*b* and a piezoelectric element 22*a*. The piezoelectric element 22*a* is the same as the piezoelectric element 2*a*, described above, of the first embodiment. The elastic body 22*b* includes a base 22*c*, a first contact portion pair 22*d*1, and a second contact portion pair 22*d*2. Extremity ends of the first contact portion pair 22*d*1 form contact surfaces 22*e*1 which are brought into pressure contact with the driven element 3 to thereby frictionally drive the driven element 3, and extremity ends of the second contact portion pair 22*d*2 also form contact surfaces 22*e*2 which are brought into pressure contact with the driven element 3 to thereby frictionally drive the driven element 3.

The elastic body 22*b* is an elastic member made of metal, e.g. a martensitic stainless steel. Further, the elastic body 22*b* is subjected to e.g. quenching treatment as hardening treatment for increasing durability thereof. Further, the elastic body 22*b* formed with the first contact portion pair 22*d*1 and the second contact portion pair 22*d*2 can be manufacture by bending a substantially H-shaped metal plate using the same method as that for forming the contact portions 2*d* on the elastic body 2*b* of the first embodiment.

By simultaneously exciting vibrations in the first and second vibration modes in the vibration element 22 as described hereafter, the first contact portion pair 22*d*1 and the second contact portion pair 22*d*2 frictionally drive the driven element 3. This makes it possible to move the vibration element 22 and the driven element 3 relative to each other in the X direction.

Figure 8A:
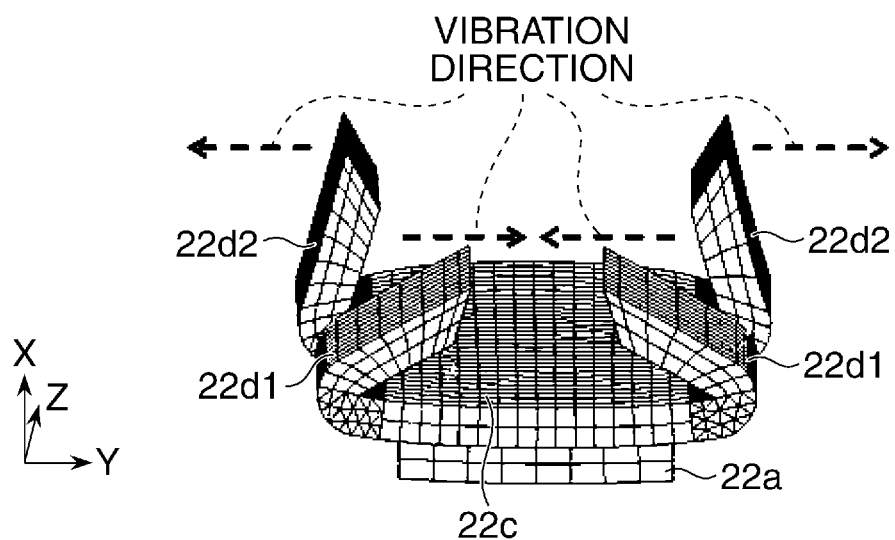
FIGS. 8A and 8B are perspective views useful in explaining deformation of the vibration element in the first vibration mode excited in the vibration element as a component of the vibration actuator.
Figure 8B:
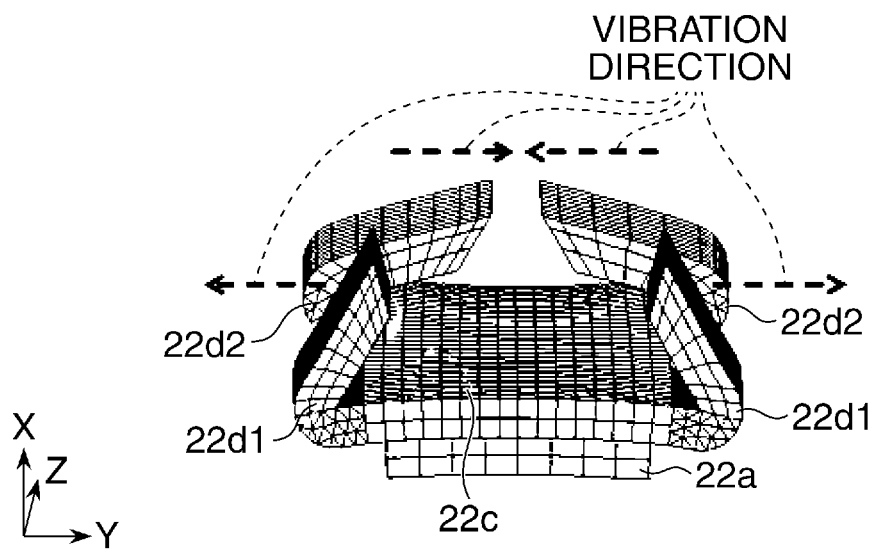

FIGS. 8A and 8B are perspective views useful in explaining deformation of the vibration element 22 in the first vibration mode excited in the vibration element 22. Note that in FIGS. 8A and 8B, to make deformation of the vibration element 22 easier to recognize, the vibration element 22 is illustrated with deformation enlarged compared with the shape of the vibration element 22.

In the first vibration mode, as shown in FIG. 8A, the vibration element 22 is deformed at a certain moment such that the contact surfaces 22*e*1 of the first contact portion pair 22*d*1 are moved closer to each other in the Y direction, and at the same time, the contact surfaces 22*e*2 of the second contact portion pair 22*d*2 are moved away from each other in the Y direction. Further, in the first vibration mode, as shown in FIG. 8B, the vibration element 22 is deformed at another moment such that the contact surfaces 22*e*1 of the first contact portion pair 22*d*1 are moved away from each other in the Y direction, and at the same time, the contact surfaces 22*e*2 of the second contact portion pair 22*d*2 are moved closer to each other in the Y direction. That is, in the first vibration mode, vibrations are excited which cause the first contact portion pair 22*d*1 and the second contact portion pair 22*d*2 to perform motions in opposite directions, i.e. such that the contact surfaces 22*e*1 of the first contact portion pair 22*d*1 are alternately moved closer to each other or away from each other in the Y direction, in an opposite manner to the contact surfaces 22*e*2 of the second contact portion pair 22*d*2 that are alternately moved away from each other or closer to each in the Y direction.

Figure 9A:
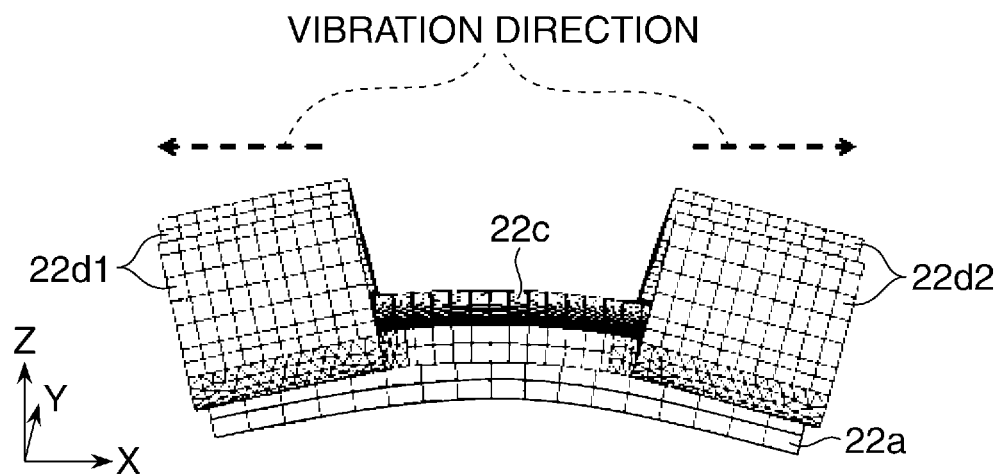
FIGS. 9A and 9B are perspective views useful in explaining deformation of the vibration element in the second vibration mode excited in the vibration element as a component of the vibration actuator.
Figure 9B:
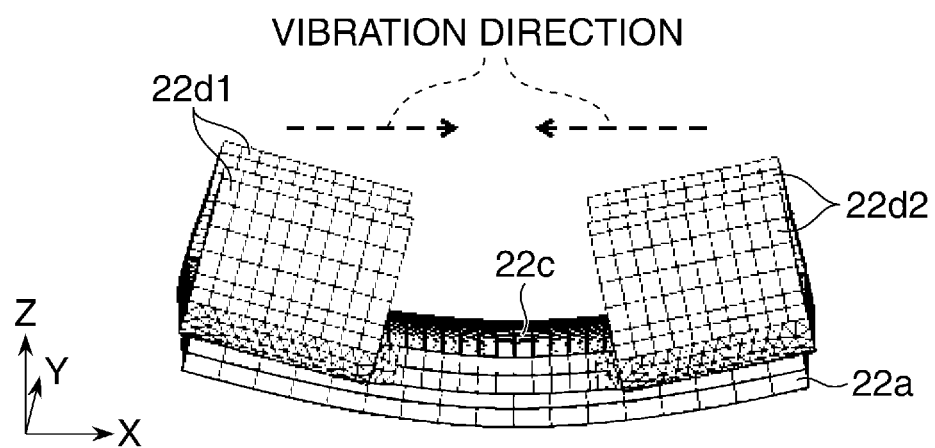

FIGS. 9A and 9B are perspective views useful in explaining deformation of the vibration element 22 in the second vibration mode excited in the vibration element 22. Note that also in FIGS. 9A and 9B, to make deformation of the vibration element 22 easier to recognize, the vibration element 22 is illustrated with deformation enlarged compared with the shape of the vibration element 22.

In the second vibration mode, the first-order flexural vibration in the X direction is generated in the base 22c of the vibration element 22. That is, in the second vibration mode, the vibration element 22 is deformed at a certain moment such that the first contact portion pair 22d1 and the second contact portion pair 22d2 are moved away from each other in the X direction, as shown in FIG. 9A. Further, in the second vibration mode, the vibration element 22 is deformed at another moment such that the first contact portion pair 22d1 and the second contact portion pair 22d2 are moved closer to each other in the X direction, as shown in FIG. 9B. That is, in the second vibration mode, reciprocal vibrations are excited which cause the first contact portion pair 22d1 and the second contact portion pair 22d2 to be repeatedly moved away from each other and moved closer to each other in the X direction.

The dimensions of the base 22c of the elastic body 22b in the X and Y directions, the dimension of each contact portion 22d in the Z direction, etc., are designed such that a natural vibration frequency in the first vibration mode and a natural vibration frequency in the second vibration mode are substantially equal to each other. Further, each of the magnitudes of pressure forces that act on the driven element 3 from the first contact portion pair 22d1 and the second contact portion pair 22d2, respectively, can be set to a desired value e.g. by increasing or reducing the amount of deformation of each contact portion pair in the Y direction, or changing the rigidity of each contact portion pair in the Y direction.

A description will be given of the movement of the first contact portion pair 22d1 and the movement of the second contact portion pair 22d2, which are performed when vibrations in the first vibration mode and the second vibration mode are combined, by taking an example of a case where when the first vibration mode is in the state shown in FIG. 8A, the second vibration mode is in state shown in FIG. 9A, and when the first vibration mode is in the state shown in FIG. 8B, the second vibration mode is in the state shown in FIG. 9B.

When the first vibration mode is in the state shown in FIG. 8A, the first contact portion pair 22d1 is deformed in a manner moved to the driven element 3 to be brought into pressure contact with the driven element 3, but the second contact portion pair 22d2 is deformed in a manner moved away from the driven element 3. If the second vibration mode is in the state shown in FIG. 9A at this time, the first contact portion pair 22d1 moved to be brought into pressure contact with the driven element 3 applies a force for driving the driven element 3 to the left as viewed in FIG. 9A to the driven element 3. However, the second contact portion pair 22d2 being moved to the right as viewed in FIG. 9A is caused to be moved away from the driven element 3 by the vibration in the first vibration mode, and hence a force for driving the driven element 3 to the right is not transmitted to the driven element 3. Therefore, the driven element 3 is driven to the left as viewed in FIG. 9A.

On the other hand, when the first vibration mode is in the state shown in FIG. 8B, the second contact portion pair 22d2 is deformed in a manner moved to the driven element 3 to be brought into pressure contact with the driven element 3, but the first contact portion pair 22d1 is deformed in a manner moved away from the driven element 3. Since the second vibration mode is in the state shown in FIG. 9B at this time, the second contact portion pair 22d2 moved to be brought into pressure contact with the driven element 3 applies a force for driving the driven element 3 to the left as viewed in FIG. 9B to the driven element 3. However, the first contact portion pair 22d1 which is moving to the right as viewed in FIG. 9B is caused to be moved away from the driven element 3 by the vibration in the first vibration mode, and hence a force for driving the driven element 3 to the right is not transmitted to the driven element 3. Therefore, the driven element 3 is driven to the left as viewed in FIG. 9B.

As described above, in both of the above-described cases, the driven element 3 is driven to the left as viewed in FIGS. 9A and 9B. Note that by inverting the time phase for combining the first vibration mode and the second vibration mode, it is possible to drive the driven element 3 to the right as viewed in FIGS. 9A and 9B. That is, in the vibration actuator 20, by combining the vibrations in the first vibration mode and the second vibration mode, the contact surfaces 22e1 of the first contact portion pair 22d1 and the contact surfaces 22e2 of the second contact portion pair 22d2 are caused to perform elliptical motion within the substantially X-Y plane. Then, the contact surfaces 22e1 of the first contact portion pair 22d1 and the contact surfaces 22e2 of the second contact portion pair 22d2 alternately apply a frictional driving force (thrust) to the sliding surfaces of the driven element 3 to thereby drive the driven element 3 in the X direction.

As described above, the vibration actuator 20 includes the two contact portion pairs, and for example, when the first contact portion pair 22d1 is moved in a direction away from the driven element 3, the second contact portion pair 22d2 is moved to the driven element 3 to transmit the thrust to the driven element 3. This makes it possible to more stably hold the driven element 3 than the vibration actuator 1 that drives the driven element 3 using the pair of contact portions 2d, and therefore, it is possible to more stably drive the vibration actuator 20.

Further, in the vibration actuator 20, the pressure forces which act on the driven element 3 from the first contact portion pair 22d1 and the pressure forces which act on the driven element 3 from the second contact portion pair 22d2 act in a direction of sandwiching the driven element 3 in the Y direction, respectively. That is, in the vibration actuator 20, a reaction force of a pressure force which acts on the driven element 3 from one contact portion of the first contact portion pair 22d1 is received by the other contact portion of the same, and a reaction force of a pressure force which acts on the driven element 3 from one contact portion of the second contact portion pair 22d2 is received by the other contact portion. With this configuration, it is unnecessary to provide portions for receiving the reaction forces of the pressure forces which act on the driven element 3, other than the first contact portion pair 22d1 and the second contact portion pair 22d2. Therefore, the vibration actuator 20 also makes it possible to simplify the pressurizing structure for bringing the vibration element 22 and the driven element 3 into pressure contact with each other, similar to the vibration actuator 1, whereby it possible to obtain the same advantageous effects as provided by the vibration actuator 1.

Next, a description will be given of a fourth embodiment of the present invention. The fourth embodiment is an example of application of the vibration actuator according to the above-described embodiments to an image pickup apparatus.

Figure 10A:
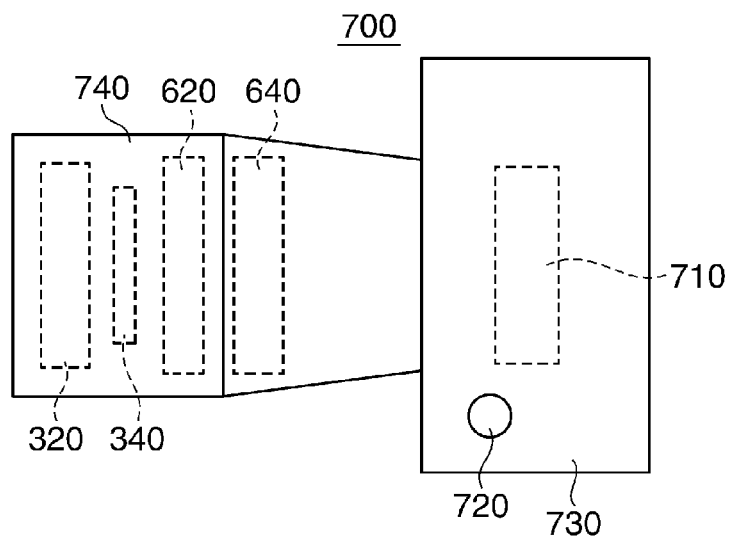
FIG. 10A is a schematic top view of an image pickup apparatus using the vibration actuator according to the first embodiment, shown in FIGS. 1A to 1C.

FIG. 10A is a schematic top view of the image pickup apparatus, denoted by reference numeral 700. The image pickup apparatus 700 includes a camera body 730 equipped with an image pickup device 710 and a power button 720. Further, the image pickup apparatus 700 is equipped with a lens barrel 740 including a first lens group (not shown), a second lens group 320, a third lens group (not shown), a fourth lens group 340, and vibration actuator devices 620 and 640. The lens barrel 740, as an interchangeable lens, can be replaced by another, and the suitable lens barrel 740 can be mounted on the camera body 730 according to an object to be photographed. In the image pickup apparatus 700, the second lens group 320 and the fourth lens group 340 are driven by the two vibration actuator devices 620 and 640, respectively.

The vibration actuator device 620 has a configuration to which is applied the vibration actuator 1 described in the first embodiment, and includes, for example, vibration elements 2, an annular driven element, and a drive circuit for applying a driving voltage to the piezoelectric element 2a of each vibration element 2. The driven element is set within the lens barrel 740 in such a manner that a radial direction thereof is substantially orthogonal to the optical axis. The driven element, in a state set in the lens barrel 740, has surfaces parallel to each other which are substantially orthogonal to the optical axis and are opposed to each other in the optical axis direction. The vibration elements 2, the number of which is three, for example, are arranged on a circumference about the optical axis at substantially equally-spaced intervals such that each pair of contact portions 2d sandwich the surfaces of the driven element, opposed to each other in the optical axis direction, to thereby apply a thrust to the driven element in a tangential direction of a circle about the optical axis. With this configuration, in the vibration actuator device 620, the driven element is rotated about the optical axis, and the rotational output of the driven element is converted to linear movement in the optical axis direction e.g. via a gear, whereby it is possible to move the second lens group 320 in the optical axis direction. The vibration actuator device 640 has the same configuration as the vibration actuator device 620, and thereby moves the fourth lens group 340 in the optical axis direction.

Figure 10B:
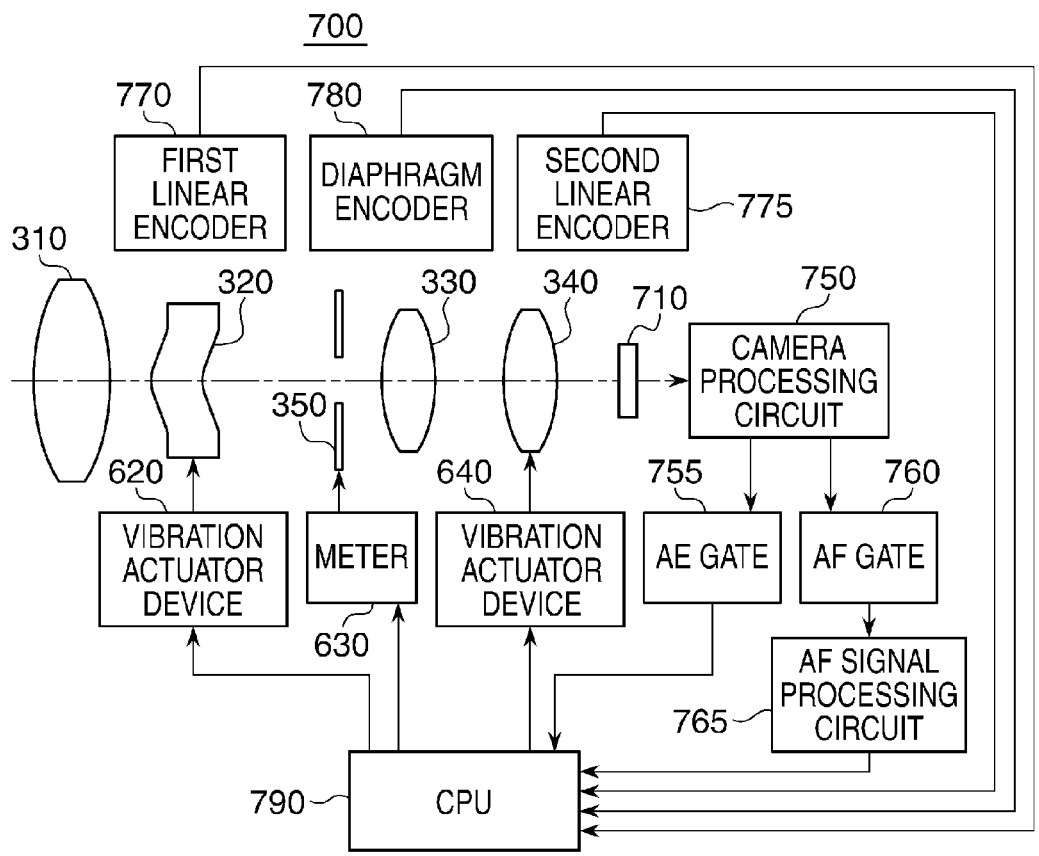
FIG. 10B is a schematic block diagram of the image pickup apparatus.

FIG. 10B is a schematic block diagram of the image pickup apparatus 700. The first lens group, denoted by reference numeral 310, the second lens group 320, the third lens group, denoted by reference numeral 330, the fourth lens group 340, and a light amount adjustment unit 350 are arranged at respective predetermined locations on the optical axis within the lens barrel 740. Light having passed through the first to fourth lens groups 310 to 340 and the light amount adjustment unit 350 forms an image on the image pickup device 710. The image pickup device 710 converts the optical image to electric signals, and outputs the electric signals, which are sent to a camera processing circuit 750.

The camera processing circuit 750 performs amplification, gamma correction, and so forth, on the signals output from the image pickup device 710. The camera processing circuit 750 is connected to a CPU 790 via an AE gate 755, and is connected to the CPU 790 via an AF gate 760 and an AF signal processing circuit 765. A video signal subjected to predetermined processing by the camera processing circuit 750 is sent to the CPU 790 via the AE gate 755, and via the AF gate 760 and the AF signal processing circuit 765. Note that the AF signal processing circuit 765 extracts high-frequency components from the video signal to thereby generate an evaluation value signal for auto focus (AF), and supplies the generated evaluation value signal to the CPU 790.

The CPU 790 is a control circuit that controls the overall operation of the image pickup apparatus 700, and generates control signals for exposure determination and focus adjustment based on the acquired video signal. The CPU 790 controls the driving of the vibration actuator devices 620 and 640 and a meter 630 to thereby adjust positions of the second lens group 320, the fourth lens group 340, and the light amount adjustment unit 350, in the optical axis direction, so as to obtain the determined exposure and a proper focus state. Under the control of the CPU 790, the vibration actuator device 620 moves the second lens group 320 in the optical axis direction, and the vibration actuator device 640 moves the fourth lens group 340 in the optical axis direction, while the meter 630 controls the driving of the light amount adjustment unit 350.

A first linear encoder 770 detects the position of the second lens group 320, driven by the vibration actuator device 620, in the optical axis direction, and a detection result is notified to the CPU 790, whereby the detection result is fed back to the driving of the vibration actuator device 620. Similarly, a second linear encoder 775 detects the position of the fourth lens group 340, driven by the vibration actuator device 640, in the optical axis direction, and a detection result is notified to the CPU 790, whereby the detection result is fed back to the driving of the vibration actuator device 640. A diaphragm encoder 780 detects the position of the light amount adjustment unit 350 in the optical axis direction, and a detection result is notified to the CPU 790, whereby the detection result is fed back to the driving of the meter 630.

In a case where the vibration actuator 1 or the like is used for moving a predetermined lens group in the optical axis direction, a large holding force is maintained even in a state in which the lens group is stopped. This makes it possible to prevent the lens group from being displaced even when an external force acts on the lens barrel or the body of the image pickup apparatus.

Although in the present example, the description is given of the example in which the lens groups are moved in the optical axis direction using the vibration actuator devices 620 and 640 each including the annular driven element, the configuration to which is applied the vibration actuator 1 for moving the lens groups in the optical direction is not limited to this. For example, the vibration element 2 can linearly move the driven element in the X direction, as described in the first embodiment. Therefore, with a configuration in which a holding member holding the lens is mounted on the driven element 3 and the optical axis direction of the lens and the direction of driving the driven element 3 are made substantially parallel to each other, it is possible to move the lens groups in the optical axis direction.

Note that in a case where a camera shake correction lens is incorporated in the lens barrel, the vibration element 2 can be used for a camera shake correction unit that moves the camera shake correction lens in a desired direction within a plane substantially orthogonal to the optical axis. In this case, to enable the lens holding member to move in two directions orthogonal to each other within the plane substantially orthogonal to the optical axis, one or a plurality of vibration elements 2 for driving the lens holding member in each direction is/are arranged. The camera shake correction unit may have a configuration in which the image pickup device 710 incorporated in the image pickup apparatus main unit is moved in a desired direction within the plane substantially orthogonal to the optical axis, in place of the configuration for driving the camera shake correction lens.

The vibration actuator 1 or the like has each contact portion pair formed into a shape forming an acute angle, and hence in a case where the vibration actuator 1 is disposed within an apparatus having an inner corner, it is possible to make efficient use of space in the inner corner, and hence it is possible to realize size reduction of the whole apparatus.

Next, a description will be given of a fifth embodiment of the present invention. The fifth embodiment is an example of application of the vibration actuator 1 (or 10, 20) to an X-Y stage of a microscope, and the X-Y stage of the microscope is equipped with at least two vibration actuators.

Figure 11:
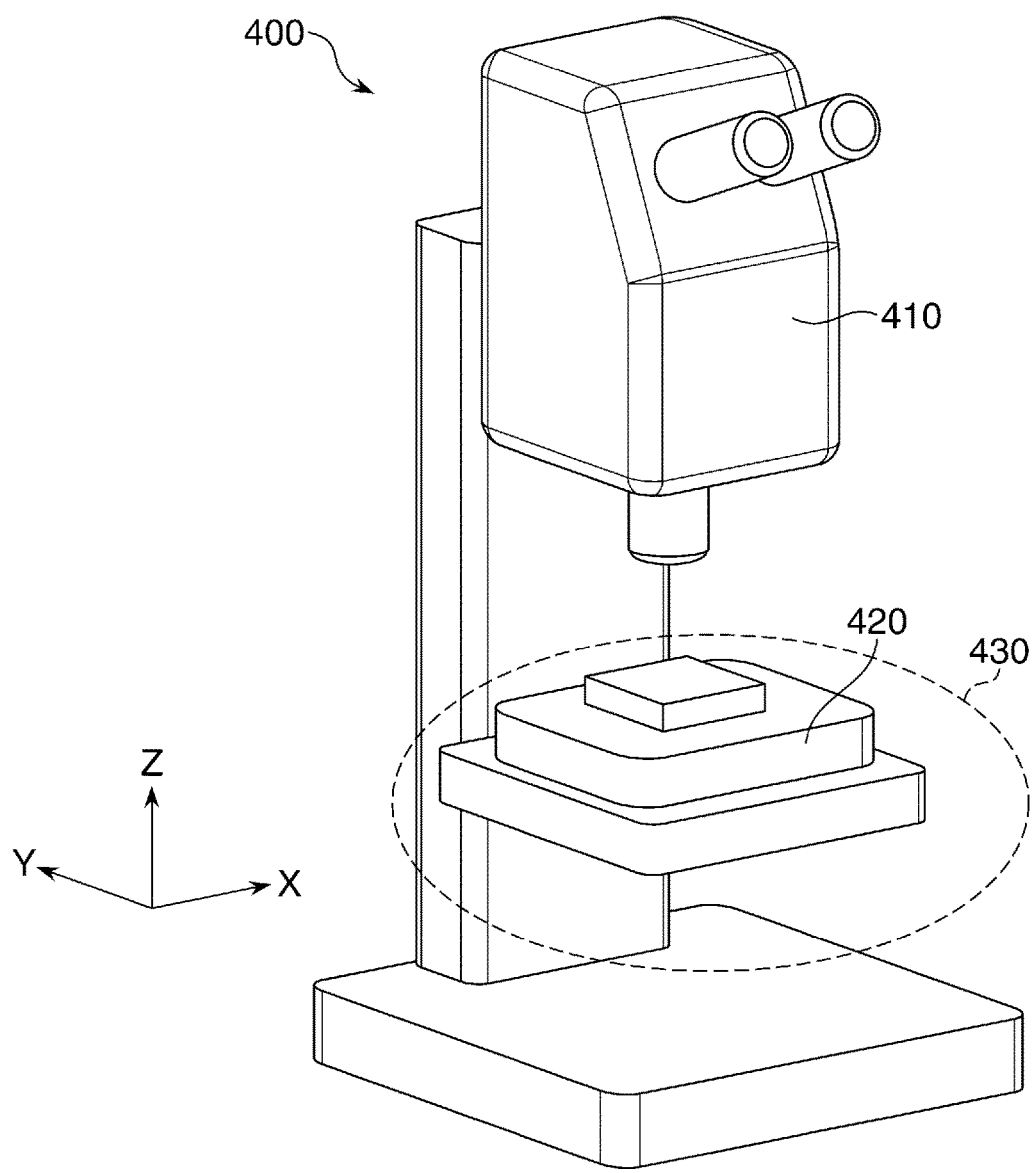
FIG. 11 is a perspective view of the appearance of a microscope as an example of a stage device using the vibration actuator according to the first embodiment, shown in FIGS. 1A to 1C.

FIG. 11 is a perspective view of the appearance of a microscope 400. The microscope 400 includes an image pickup section 410 that incorporates an image pickup device and an optical system, and an automatic stage 430 provided on a base, which is an example of a stage device including a stage 420 which is moved within an X-Y plane by the vibration actuator. At least one vibration actuator is used for driving the stage in the X direction, and is set such that the X direction of the vibration element 2 matches the X direction of the stage 420. At least one vibration actuator is used for driving the stage in the Y direction, and is set such that the X direction of the vibration element 2 matches the Y direction of the stage 420.

An object to be observed is placed on an upper surface of the stage 420, and an enlarged image is photographed by the image pickup section 410. In a case where an observation range is wide, the automatic stage 430 is driven to move the stage 420 in the X direction and the Y direction within the plane to thereby move the object to be observed, whereby a multiplicity of photographed images are acquired. By combining the photographed images by a computer, not shown, it is possible to acquire one wide-range image with high resolution. The application of the vibration actuators according to the embodiments of the present invention is not limited to the above-described apparatuses, but each vibration actuator can be widely applied to electronic devices including a component which is required to be positioned by being driven for movement by the vibration actuator.

Other Embodiments

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-218404 filed Nov. 6, 2015, which is hereby incorporated by reference herein in its entirety.

What is claimed is:

1. A vibration actuator comprising:
a vibration element which includes an electromechanical energy conversion element and an elastic body having a pair of contact portions; and
a driven element which is driven relatively to the vibration element in a first direction, the driven element including side surfaces formed respectively on two sides thereof,
wherein the pair of contact portions contact with the driven element in a third direction orthogonal to both of the first direction and a second direction which is a direction of a thickness of the electromechanical energy conversion element, and
wherein each of the contact portions includes a contact surface formed thereon such that a pair of the contact surfaces face the driven element, the contact surfaces respectively contacting the side surfaces of the driven element in the third direction and facing each other through the driven element.

2. The vibration actuator according to claim 1, wherein the pair of contact portions are formed on the elastic body such that a reaction force of a pressure force that acts on the driven element from one of the contact portions is received by the other contact portion.

3. The vibration actuator according to claim 1, wherein the pair of contact portions are formed on the elastic body in a manner sandwiching the driven element in the third direction.

4. The vibration actuator according to claim 1, wherein vibration for vibrating the pair of contact portions in the first direction and vibration for vibrating the pair of contact portions in the third direction are simultaneously excited in the vibration element to thereby cause the pair of contact portions to perform elliptic motion within a plane including the first direction and the third direction, whereby the vibration element and the driven element are moved relative to each other in the first direction.

5. The vibration actuator according to claim 1, wherein the elastic body includes two pairs of the contact portions with a predetermined spacing therebetween in the first direction, and
wherein the two pairs of the contact portions each alternately apply frictional driving forces to the driven element.

6. The vibration actuator according to claim 1, wherein the pair of contact portions are formed integrally with a base portion by bending, and the base portion is joined to the electromechanical energy conversion element.

7. The vibration actuator according to claim 1, further comprising a support member joined to the electromechanical energy conversion element via a surface thereof opposite to a surface thereof via which the electromechanical energy conversion element is joined to a base portion of the elastic body, for supporting the vibration element, and
wherein the support member includes a power supply portion for supplying voltage to the electromechanical energy conversion element, and a fixed portion used for fixing the support member.

8. An electronic apparatus including:
a vibration actuator comprising:
a vibration element which includes an electromechanical energy conversion element and an elastic body having a pair of contact portions; and
a driven element which is driven relatively to the vibration element in a first direction, the driven element including side surfaces formed respectively on two sides thereof; and
a member that is positioned by driving the vibration actuator,
wherein the pair of contact portions contact with the driven element in a third direction orthogonal to both of the first direction and a second direction which is a direction of a thickness of the electromechanical energy conversion element, and wherein each of the contact portions includes a contact surface formed thereon such that a pair of the contact surfaces face the driven element, the contact surfaces respectively contacting the side surfaces of the driven element in the third direction and facing each other through the driven element.

* * * * *